United States Patent
Kurihara

(10) Patent No.: US 6,885,353 B2
(45) Date of Patent: Apr. 26, 2005

(54) VARIABLE TYPE ANTENNA MATCHING CIRCUIT

(75) Inventor: Kazuhiro Kurihara, Tokyo (JP)

(73) Assignee: NEC Corporation, Tokyo (JP)

( * ) Notice: Subject to any disclaimer, the term of this patent is extended or adjusted under 35 U.S.C. 154(b) by 48 days.

(21) Appl. No.: 10/454,431

(22) Filed: Jun. 4, 2003

(65) Prior Publication Data

US 2004/0008151 A1 Jan. 15, 2004

(30) Foreign Application Priority Data

Jun. 5, 2002 (JP) ........................... 2002-164426

(51) Int. Cl.$^7$ ................................................ H01Q 1/50
(52) U.S. Cl. ........................................ 343/860; 343/702
(58) Field of Search ............................... 343/702, 850, 343/860, 861

(56) References Cited

U.S. PATENT DOCUMENTS 5,335,368 A * 8/1994 Tamura .................. 455/575.7
6,223,051 B1 * 4/2001 Rikihisa .................. 455/564

FOREIGN PATENT DOCUMENTS

| EP | 0518526 A1 | 12/1992 |
| GB | 1 510 755 | 5/1978 |
| GB | 2 178 616 A | 2/1987 |
| GB | 2 205 995 A | 12/1988 |
| GB | 2 293 276 A | 3/1996 |
| GB | 2 366 956 A | 3/2002 |
| JP | 2001-345882 A | 12/2001 |
| WO | WO 96/37967 | 11/1996 |

* cited by examiner

Primary Examiner—Shih-Chao Chen
(74) Attorney, Agent, or Firm—Michael Best & Friedrich LLP

(57) ABSTRACT

A variable type antenna matching circuit includes an antenna, shape change detecting section, transmission/reception radio section, and variable type antenna matching section. The shape change detecting section detects a change in the shape of the housing of a portable terminal. The transmission/reception radio section transmits and receives signals. The variable type antenna matching section changes the input impedance between the antenna and the transmission/reception radio section in accordance with an output signal from the shape change detecting section.

6 Claims, 3 Drawing Sheets

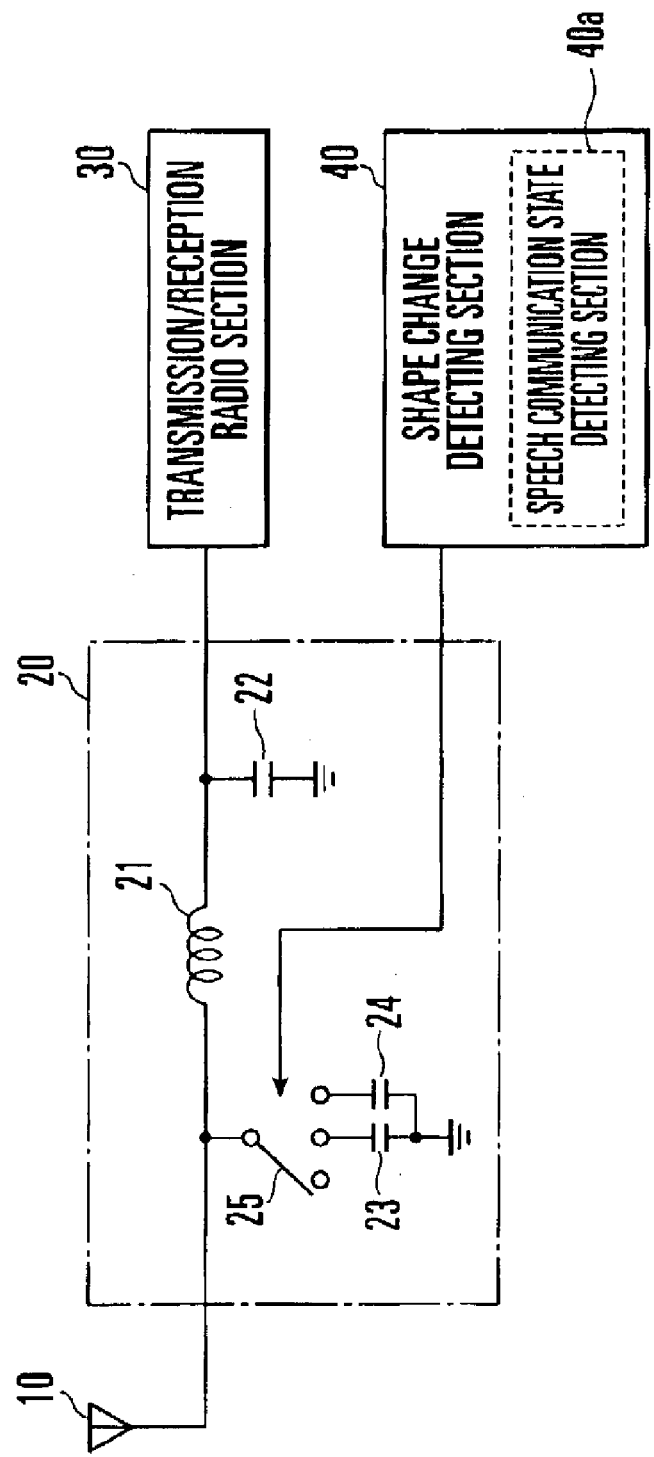

VARIABLE TYPE ANTENNA MATCHING CIRCUIT

BACKGROUND OF THE INVENTION

The present invention relates to a portable telephone terminal and, more particularly, to a portable telephone terminal or other types of portable terminals which can change their shapes by stretching or folding their housings. The present invention can also be applied to a circuit which provides input impedance matching for an antenna in accordance with a change in the input impedance of the antenna when the shape of a housing is changed.

In a portable telephone terminal, in order to optimize the radiation efficiency of an antenna, an impedance matching circuit is arranged between the antenna and a transmission/reception radio circuit. This impedance matching circuit provides impedance matching.

The shape of the housing of a folding portable telephone terminal changes as it is folded or unfolded, and hence the input impedance of the antenna changes. For this reason, in a folding telephone terminal, impedance mismatching occurs between the antenna and the transmission/reception radio circuit between when the terminal is folded (e.g., the incoming wait state) and when the terminal is unfolded (e.g., the speech communication or operation state), resulting in deterioration in antenna efficiency.

In order to cope with such impedance mismatching that occurs when the shape of the housing of a folding portable terminal changes, an arrangement has been proposed (e.g., Japanese Patent Laid-Open No. 2001-345882), in which a plurality of impedance matching circuits are prepared, and whether or not the portable terminal is folded is detected. In this arrangement, the impedance matching circuits are selected and switched depending on whether the terminal is folded or unfolded (open).

In the portable terminal disclosed in Japanese Patent Laid-Open No. 2001-345882, two matching circuits having different circuit constants are prepared in advance. These two matching circuits are selected and switched in accordance with a detection result on the open/closed state of the folding portable terminal. This portable terminal is based on the premise that two matching circuits are mounted in advance. Since the portable terminal requires a plurality of circuits with circuit constants corresponding to different impedances, the degree of freedom in design is low. For example, preparing many matching circuits will interfere with a reduction in circuit size.

SUMMARY OF THE INVENTION

It is an object of the present invention to provide a variable type antenna matching circuit with a simple circuit arrangement which can provide impedance matching between an antenna and a transmission/reception radio circuit in accordance with a change in the shape of the housing of a portable terminal.

It is another object of the present invention to provide a variable type antenna matching circuit which can improve the degree of freedom in design.

It is still another object of the present invention to provide a variable type antenna matching circuit which can realize miniaturization of a radio terminal.

In order to achieve the above objects, according to the present invention, there is provided a variable type antenna matching circuit comprising an antenna, shape change detecting means for detecting a change in a shape of a housing of a portable terminal, transmission/reception radio means for transmitting and receiving signals, and variable type antenna matching means for changing an input impedance between the antenna and the transmission/reception radio means in accordance with an output signal from the shape change detecting means.

BRIEF DESCRIPTION OF THE DRAWINGS

FIG. 4 is a block diagram showing a variable type antenna matching circuit according to the second embodiment;

DESCRIPTION OF THE PREFERRED EMBODIMENTS

The embodiments of the present invention will be described below with reference to the accompanying drawings.

A portable radio terminal according to the first embodiment of the present invention includes an antenna 10, a variable type antenna matching section 20 connected to the antenna 10, and a transmission/reception radio section 30 and shape change detecting section 40 which are connected to the variable type antenna matching section 20.

The variable type antenna matching section 20 is formed from a variable type antenna matching circuit and set between the antenna 10 and the transmission/reception radio section 30. The variable type antenna matching section 20 variably switches its impedance constants to cope with a change in the input impedance of the antenna due to a shape change on the basis of an output from the shape change detecting section 40 which detects a change in the shape of the housing of the portable radio terminal.

One terminal and the other terminal of the variable type antenna matching section 20 are respectively connected to the antenna 10 and transmission/reception radio section 30 to provide impedance matching between the antenna 10 and the transmission/reception radio section 30. The antenna 10 receives a downstream reception signal from a base station. The downstream reception signal from the base station is input from the antenna 10 to the transmission/reception radio section 30. An upstream transmission signal is sent out from the transmission/reception radio section 30 to the antenna 10.

The shape change detecting section 40 detects a change in the shape of the housing, e.g., whether or not the portable terminal is folded.

Figure 1:
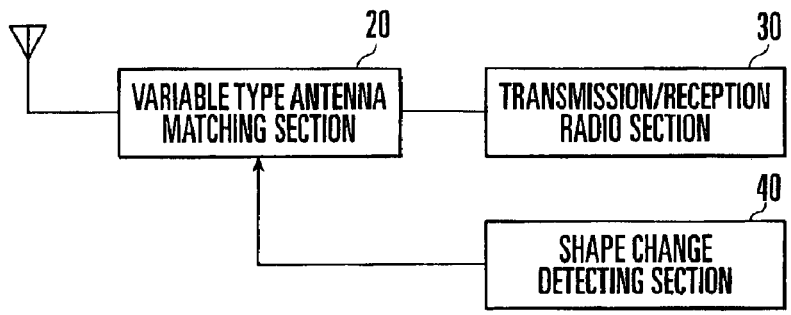
FIG. 1 is a block diagram showing an arrangement for providing antenna impedance matching for a portable radio terminal according to the first embodiment of the present invention.
Figure 2:
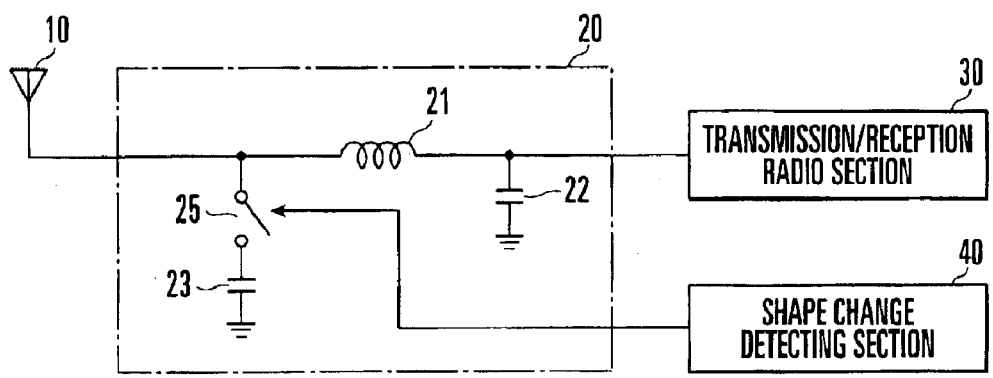
FIG. 2 is a block diagram showing the variable type antenna matching circuit of the portable radio terminal according to the first embodiment of the present invention.

As shown in FIG. 2, in the variable type antenna matching section 20 of the portable radio terminal according to the first embodiment of the present invention, capacitors 22 and 23, each having the other terminal connected to a corresponding one of the two terminals of an inductor 21 (e.g., a coil), are connected between the antenna 10 and the transmission/reception radio section 30. The capacitor 23 grounds the node between the inductor 21 and the antenna 10. The capacitor 22 grounds the node between the inductor 21 and the transmission/reception radio section 30. The variable type antenna matching section 20 also has a switch 25 which connects to/disconnects from (turns on/off) the capacitor 23 on the antenna side. The switch 25 may be set on the ground side of the capacitor 23 or the node between the inductor 21 and the antenna 10. That is, the switch 25 is connected in series with the capacitor 23.

The switch 25 is switched in accordance with an output from the shape change detecting section 40. When the switch 25 of the variable type antenna matching section 20 is turned on, the capacitance of the capacitor 23 is added to the capacitance set when the switch 25 is off. As a consequence, the impedance parameter changes. In this manner, the impedance parameter can be changed.

Assume that the switch OFF state is made to correspond to the closed state (or the contracted state) of the portable radio terminal in which impedance matching is provided, and the switch ON state is made to correspond to the open state (or the stretched state) of the portable radio terminal in which impedance matching is provided. This makes it possible to change the antenna matching circuit to a circuit having a constant that provides impedance matching in both the states, i.e., the closed state of the portable radio terminal and the open state of the housing of the portable radio terminal.

Figure 5A:
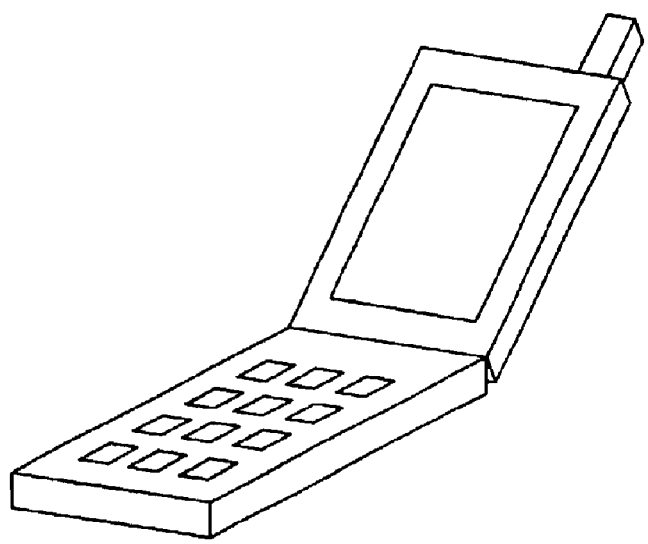
FIGS. 5A and 5B are perspective views for explaining how the shape of the housing of a folding portable radio terminal changes.
Figure 5B:
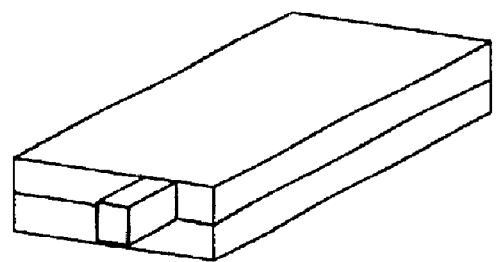

A change in the shape of the portable radio terminal will be described next. When the housing of the folding portable radio terminal is open, the display screen and keys can be seen and used, as shown in FIG. 5A. When the housing of the folding portable radio terminal is closed, the portable radio terminal is folded, and neither the display screen nor the keys can be seen, as shown in FIG. 5B.

The shape change detecting section 40 detects the open or closed state of the housing of the folding portable radio terminal shown in FIG. 5A depending on, for example, whether the switch is on or off. The shape change detecting section 40 associates the "ON" state and "OFF" state of the switch with the "open" state and "closed" state of the folding portable radio terminal, and outputs logic signals corresponding to the "ON" state and "OFF" state.

Figure 6A:
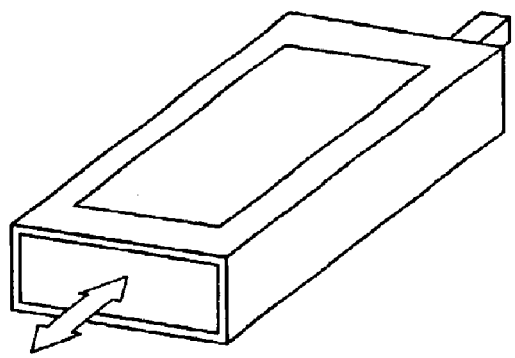
FIGS. 6A and 6B are perspective views for explaining how the shape of the stretchable housing of a portable radio terminal changes.
Figure 6B:
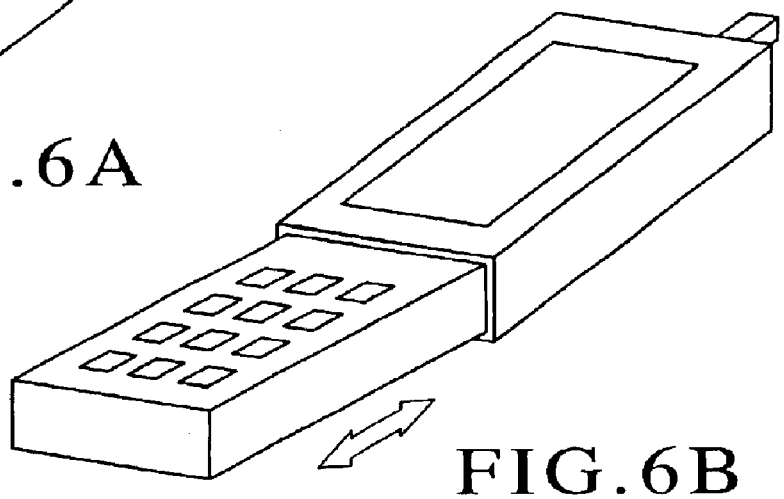

When the stretchable housing of a portable radio terminal is contracted, a housing portion on which keys are arranged is housed in a housing portion on which a display screen is arranged, as shown in FIG. 6A. When the stretchable housing of the portable radio terminal is stretched, the housing portion on which the keys are arranged is pulled out from the housing portion on which the display screen is arranged, as shown in FIG. 6B.

The shape change detecting section 40 associates the "ON" state and "OFF" state of the switch with the "stretched" state wherein the housing portion on which the keys are arranged is pulled out from the housing portion on which the display screen is arranged and the "contracted" state wherein the housing portion on which the keys are arranged is housed in the housing portion on which the display screen is arranged, and outputs logic signals corresponding to the "ON" state and "OFF" state.

Figure 3A:
FIGS. 3A, 3B, and 3C are views for explaining the operation of the variable type antenna matching circuit.
Figure 3B:
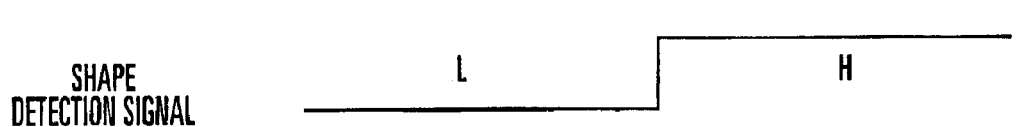
Figure 3C:

The relationship between the shape of the housing of the portable radio terminal described above, the logic signals output from the shape change detecting section 40, and the impedance constants of the matching circuit will be described with reference to FIGS. 3A to 3C.

When the housing is kept closed (or contracted), the shape change detecting section 40 outputs a logic signal L as a shape detection signal to the switch 25. Upon reception of the logic signal L from the shape change detecting section 40, the switch 25 keeps disconnected from the capacitor 23. When the capacitor 23 is kept disconnected, the impedance circuit constant in the antenna matching circuit is set to an impedance A that matches the antenna input impedance while the housing is closed. Impedance matching can therefore be provided between the antenna 10 and the transmission/reception radio section 30 while the housing is closed.

When the housing is opened (or stretched), the shape change detecting section 40 outputs a logic signal H as a shape detection signal to the switch 25. Upon reception of the logic signal H from the shape change detecting section 40, the switch 25 connects to the capacitor 23. As a consequence, the capacitor 23 is set in the connected state, and the impedance circuit constant of the antenna matching section 20 changes to an impedance B. This impedance matches the antenna input impedance in the open state of the housing.

Note that as the switch 25, a semiconductor switch such as a pin diode or GaAs switch can be used.

According to the first embodiment, there is provided a variable type antenna matching circuit in which when a shape change detection circuit for detecting a change in the shape of the housing of a portable terminal detects a change in the shape of the housing, the input impedance of an impedance matching circuit between an antenna and a transmission/reception radio circuit is changed in accordance with the change in the shape of the housing. As this variable type antenna matching circuit, an impedance matching circuit is formed, in which capacitors are grounded on the antenna side and the transmission/reception radio circuit side, respectively, on the two sides of an inductor. This circuit includes a switch for switching the capacitor on the antenna side. Note that the switch can connect to or disconnect from the capacitor on the antenna side.

In the first embodiment described above, a variable capacitor may be used as the capacitor 23 to change the capacitance in accordance with an output from the shape change detecting section 40.

A variable type antenna matching section 20 according to the second embodiment will be described next with reference to FIG. 4. The variable type antenna matching section 20 according to the second embodiment has two capacitors 23 and 24 as capacitors on the antenna 10 side.

A switch 25 selects and switches between three states, i.e., the state wherein no capacitor is connected, the state wherein the capacitor 23 is connected, and the state wherein the capacitor 24 is connected, in accordance with an output from a shape change detecting section 40.

In the variable type antenna matching section 20 according to the second embodiment, the shape change detecting section 40 has a speech communication state detecting section 40a which detects whether or not the portable radio terminal is in the speech communication state.

The shape change detecting section 40 selects one of the capacitor connection states in accordance with a detection result indicating one of three states, i.e., the state wherein the housing is closed, the state wherein the housing is open and speech communication is not being performed, and the state wherein the housing is open and speech communication is being performed.

In a speech communication state, the housing and antenna are located near the head of the user. When the portable terminal is used only to transmit/receive data such as messages, the terminal is used while the antenna is located near the ground surface.

The second embodiment copes with a case wherein the antenna exhibits different impedances and hence different antenna characteristics depending on whether or not the antenna is located near the ground surface.

In the second embodiment, the capacitors 23 and 24 are switched in accordance with an output from the shape change detecting section 40 to provide impedance matching in accordance with the three antenna states of the antenna of the portable terminal.

In the second embodiment, an antenna matching circuit is designed such that capacitors are grounded on the two sides of an inductor (coil), and the capacitors on the antenna side are switched in accordance with an output from a shape change detecting circuit. With this arrangement, one antenna matching circuit can be matched with circuit constants corresponding to a plurality of housing shapes, and one antenna matching circuit can provide impedance matching in accordance with a plurality of housing states.

The shape change detecting circuit includes a speech communication state detecting circuit for detecting whether or not a speech communication is being performed. This arrangement allows selection of different capacitors depending on whether the housing shape changes and speech communication is not being performed or speech communication is being performed. This makes it possible to detect whether or not speech communication is being performed while the folding radio terminal is open, and to select a capacitor so as to change the impedance constant of the antenna matching circuit depending on whether or not speech communication is being performed.

In the second embodiment, variable capacitors may be used as the capacitors 23 and 24, and the capacitance may be changed in accordance with outputs from the shape change detecting section 40 and speech communication state detecting section 40*a*.

The variable type antenna matching circuit according to each embodiment of the present invention is designed only to change the circuit constant by switching the capacitors in the antenna matching circuit in accordance with an output from the shape change detecting circuit. Therefore, there is no need to prepare a plurality of matching circuits. In addition, since the number of circuit elements required in this circuit is small, an increase in the size of the antenna matching circuit can be suppressed, and miniaturization of the circuit can be achieved. Furthermore, a switch, an inductor, and capacitors as circuit elements can be formed by using an integrated circuit. This integrated circuit can be formed on the same circuit board as that for a transmission/reception radio circuit. This makes it possible to cope with a change in the input impedance characteristics of the antenna.

What is claimed is:

1. A variable type antenna matching circuit comprising:

an antenna;

shape change detecting means for detecting a change in a shape of a housing of a portable terminal;

transmission/reception radio means for transmitting and receiving signals; and variable type antenna matching means for changing an input impedance between said antenna and said transmission/reception radio means in accordance with an output signal from said shape change detecting means;

wherein said shape change detecting means further comprising speech communication state detecting means for detecting whether or not speech communication is being performed, and said variable type antenna matching means changes an input impedance between said antenna and said transmission/reception radio means in accordance with an output from the speech communication state detecting means when said shape change detecting means detects a change of the housing shape.

2. A circuit according to claim 1, wherein said variable type antenna matching means comprises an inductor connected between said antenna and said transmission/reception radio means, a first capacitor which grounds a node between said antenna and said inductor, a second capacitor which grounds a node between said inductor and said transmission/reception radio means, and a switch which switches values of the first capacitor in accordance with an output from said shape change detecting means.

3. A circuit according to claim 2, wherein the switch is connected in series with the first capacitor and turned on/off in accordance with an output from said shape change detecting means.

4. A circuit according to claim 2, wherein the first capacitor comprises a plurality of capacitors, and the switch switches the first capacitor in accordance with an output from said shape change detecting means.

5. A circuit according to claim 1, wherein the housing of a portable terminal has a folding type shape and can change between an open state and a closed state, and when the shape change detecting means detects the open state of the housing and the speech communication state detecting means detects that the portable terminal is in the speech communication state, the antenna matching means performs the input impedance matching of the antenna.

6. A circuit according to claim 1, wherein the housing of a portable terminal has a stretchable type shape and can change between a stretched state and a contracted state, and when the shape change detecting means detects that the housing is in the stretched state and the speech communication state detecting means detects that the portable terminal is in the speech communication state, the antenna matching means performs the input impedance matching of the antenna.

* * * * *